US011749315B2

(12) United States Patent
Kang et al.

(10) Patent No.: US 11,749,315 B2
(45) Date of Patent: Sep. 5, 2023

(54) 3D DRAM STRUCTURE WITH HIGH MOBILITY CHANNEL

(71) Applicant: Applied Materials, Inc., Santa Clara, CA (US)

(72) Inventors: Chang Seok Kang, Santa Clara, CA (US); Tomohiko Kitajima, San Jose, CA (US); Gill Yong Lee, San Jose, CA (US); Sanjay Natarajan, Portland, OR (US); Sung-Kwan Kang, San Jose, CA (US); Lequn Liu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/551,538

(22) Filed: Dec. 15, 2021

(65) Prior Publication Data
US 2022/0108728 A1    Apr. 7, 2022

Related U.S. Application Data

(62) Division of application No. 16/779,830, filed on Feb. 3, 2020, now Pat. No. 11,295,786.

(60) Provisional application No. 62/801,908, filed on Feb. 6, 2019.

(51) Int. Cl.
*G11C 5/06* (2006.01)
*H10B 12/00* (2023.01)

(52) U.S. Cl.
CPC .............. *G11C 5/063* (2013.01); *H10B 12/02* (2023.02); *H10B 12/03* (2023.02); *H10B 12/0335* (2023.02); *H10B 12/05* (2023.02); *H10B 12/30* (2023.02); *H10B 12/318* (2023.02); *H10B 12/482* (2023.02); *H10B 12/488* (2023.02)

(58) Field of Classification Search
CPC ......... H01L 27/10855–10891; H01L 27/1277; H01L 27/127; H01L 27/1285; H01L 21/02667; H01L 21/02672; G11C 5/063; H10B 12/482; H10B 12/488; H10B 12/0335; H10B 12/05; H10B 12/318; H10B 12/02; H10B 12/03; H10B 12/30; H10B 20/50
USPC ........................... 257/296–300; 438/238–242
See application file for complete search history.

(56) References Cited

U.S. PATENT DOCUMENTS

| 7,595,262 B2 | 9/2009 | Schlösser |
| 7,649,763 B2 | 1/2010 | Takashima |
| 10,607,995 B2 * | 3/2020 | Roberts ............. H01L 29/42376 |
| 10,804,273 B2 | 10/2020 | Ramaswamy |

(Continued)

FOREIGN PATENT DOCUMENTS

TW          200603343 A      1/2006

OTHER PUBLICATIONS

PCT International Search Report and Written Opinion in PCT/US2020/016467 dated May 28, 2020, 10 pages.

(Continued)

*Primary Examiner* — Jose R Diaz
(74) *Attorney, Agent, or Firm* — Servilla Whitney LLC

(57) ABSTRACT

Memory devices are described. The memory devices include a plurality of bit lines extending through a stack of alternating memory layers and dielectric layers. Each of the memory layers comprises a single crystalline-like silicon layer and includes a first word line, a second word line, a first capacitor, and a second capacitor. Methods of forming stacked memory devices are also described.

12 Claims, 16 Drawing Sheets

(56) References Cited

U.S. PATENT DOCUMENTS

| | | |
|---|---|---|
| 10,825,815 B2 | 11/2020 | Tang et al. |
| 11,295,786 B2 * | 4/2022 | Kang ................ H01L 27/10885 |
| 2010/0013107 A1 | 1/2010 | Sandhu et al. |
| 2010/0330752 A1 | 12/2010 | Jeong et al. |
| 2016/0049406 A1 | 2/2016 | Sandhu |
| 2018/0323199 A1 | 11/2018 | Roberts et al. |
| 2018/0323200 A1 | 11/2018 | Tang et al. |
| 2020/0202900 A1 * | 6/2020 | Kang ....................... G11C 7/18 |

OTHER PUBLICATIONS

Lee, Seok-Woon, et al., "Low Temperature Poly-Si Thin-Film Transistor Fabrication by Metal-Induced Lateral Crystallization", IEEE Electron Device Letters, vol. 17, No. 4, Apr. 1996, pp. 160-162.

Schmidt, J. A., et al., "Nickel-induced crystallization of amorphous silicon", Journal of Physics: Conference Series 167 (2009) 012046, 7 pages.

* cited by examiner

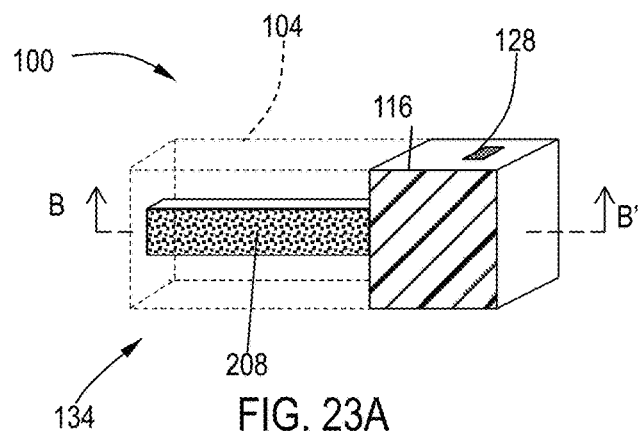
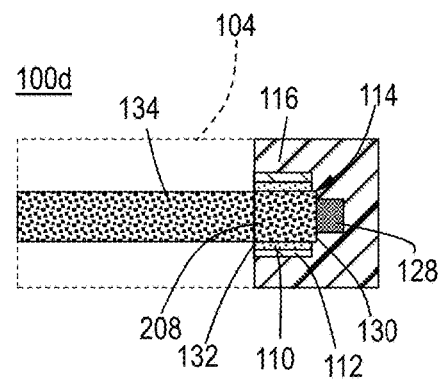
FIG. 23A  FIG. 23B
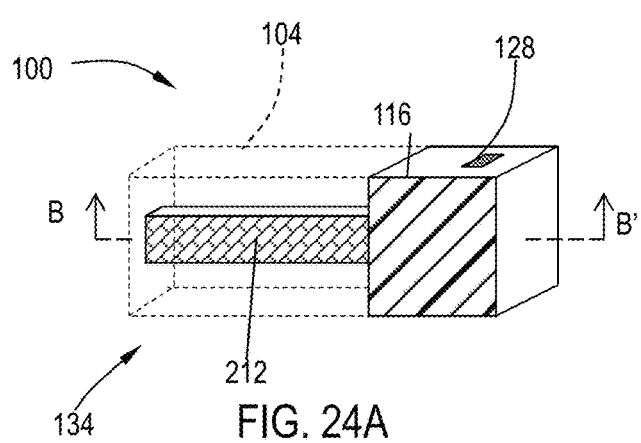
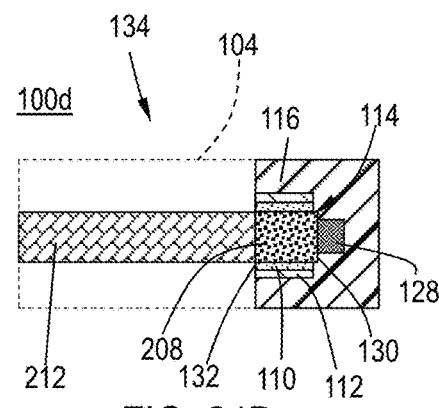
FIG. 24A  FIG. 24B
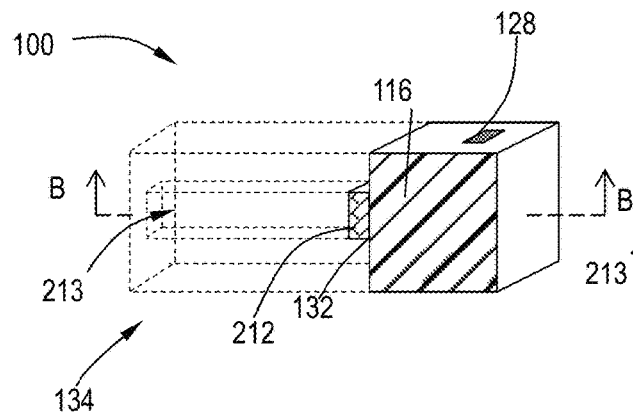
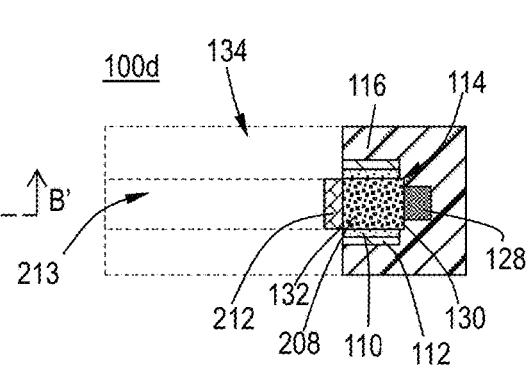
FIG. 25A  FIG. 25B

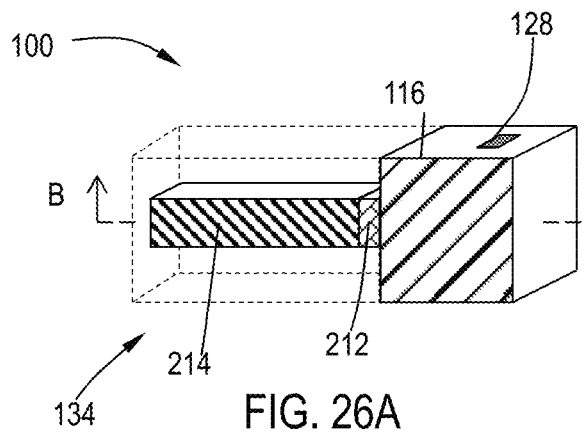
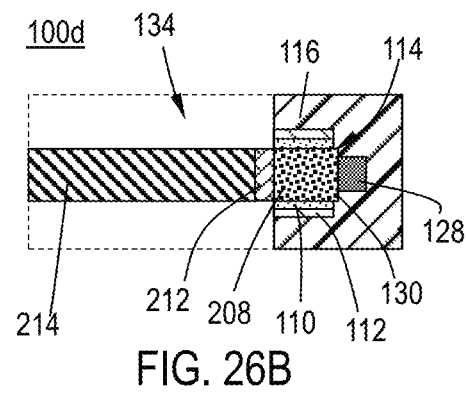
FIG. 26A                FIG. 26B
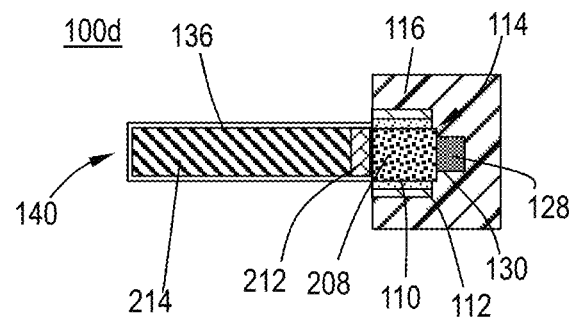
FIG. 27
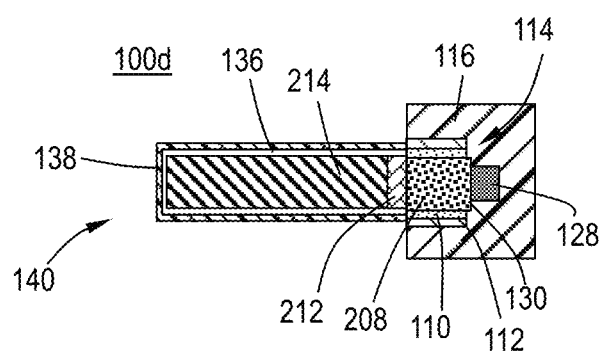
FIG. 28

3D DRAM STRUCTURE WITH HIGH MOBILITY CHANNEL

CROSS-REFERENCE TO RELATED APPLICATIONS

This application is a divisional of U.S. application Ser. No. 16/779,830, filed Feb. 3, 2020, now U.S. Pat. No. 11,295,786, issued Apr. 5, 2022, which claims priority to U.S. Provisional Application No. 62/801,908, filed Feb. 6, 2019, the entire disclosures of which are hereby incorporated by reference herein.

TECHNICAL FIELD

Embodiments of the present disclosure pertain to the field of electronic devices and electronic device manufacturing. More particularly, embodiments of the disclosure provide dynamic random-access memory with a high mobility channel.

BACKGROUND

Electronic devices, such as personal computers, workstations, computer servers, mainframes and other computer related equipment such as printers, scanners and hard disk drives use memory devices that provide substantial data storage capability, while incurring low power consumption. There are two major types of random-access memory cells, dynamic and static, which are well-suited for use in electronic devices. Dynamic random-access memories (DRAMs) can be programmed to store a voltage which represents one of two binary values, but require periodic reprogramming or "refreshing" to maintain this voltage for more than very short periods of time. Static random-access memories (SRAM) are so named because they do not require periodic refreshing.

DRAM memory circuits are manufactured by replicating millions of identical circuit elements, known as DRAM cells, on a single semiconductor wafer. Each DRAM cell is an addressable location that can store one bit (binary digit) of data. In its most common form, a DRAM cell consists of two circuit components: a field effect transistor (FET) and a capacitor.

The manufacturing of a DRAM cell includes the fabrication of a transistor, a capacitor, and three contacts: one each to the bit line, the word line, and the reference voltage. DRAM manufacturing is a highly competitive business. There is continuous pressure to decrease the size of individual cells and to increase memory cell density to allow more memory to be squeezed onto a single memory chip, especially for densities greater than 256 Megabits. Limitations on cell size reduction include the passage of both active and passive word lines through the cell, the size of the cell capacitor, and the compatibility of array devices with non-array devices To fabricate a transistor for a DRAM cell, there needs be an active semiconductor, or memory, layer. The semiconductor, or memory, layer that is formed by deposition is typically poly-crystalline or in an amorphous state. Amorphous or poly-crystalline silicon have a grain boundary which hinders the path of electronic charges, resulting in degraded transistor performance. Accordingly, there is a need for 3-D DRAM cells using large grain size single crystalline semiconductor, or memory, layers. Additionally, there is a need for methods and apparatus for forming the 3-D DRAM devices.

SUMMARY

Embodiments of the disclosure are directed to memory devices, methods of forming memory devices, and processing tools for performing the method. In one or more embodiments, a memory device comprises a plurality of bit lines extending through a stack of alternating memory layers and dielectric layers, each of the memory layers comprising a first word line comprising a single crystalline-like silicon layer and having a first side adjacent a first side of the plurality of bit lines and a second side opposite the first side, a second word line comprising a single crystalline-like silicon layer and having a first side adjacent a second side of the plurality of bit lines and a second side opposite the first side, at least one first capacitor comprising a single crystalline-like silicon layer, the at least one first capacitor adjacent the second side of the first word line, and at least one second capacitor comprising a single crystalline-like silicon layer, the at least one second capacitor adjacent the second side of the second word line.

In one or more embodiments, a memory device comprises a plurality of bit lines extending through a stack of alternating memory layers and dielectric layers, each of the memory layers comprising a first word line comprising a single crystalline-like silicon layer and having a first side adjacent a first side of the plurality of bit lines and a second side opposite the first side, a second word line comprising a single crystalline-like silicon layer and having a first side adjacent a second side of the plurality of bit lines and a second side opposite the first side, at least one first capacitor comprising a metal material and a highly doped silicon layer, the at least one first capacitor adjacent the second side of the first word line, and at least one second capacitor comprising a metal material and a highly doped silicon layer, the at least one second capacitor adjacent the second side of the second word line.

In one or more embodiments, a method of forming a memory device comprises forming an opening extending through a stack of alternating dielectric layers and memory layers; depositing a crystallizing agent into the opening; crystallizing the memory layers to form single crystalline-like silicon layers; forming a plurality of pre-word line extensions by etching at least one channel through the stack of alternating dielectric layers and single crystalline-like silicon layers, and selectively removing the dielectric layers; forming a first word line with a first side and a second side opposite the first side, by depositing a first word line metal on the plurality of pre-word line extensions to electrically connect the plurality of pre-word line extensions; patterning the alternating dielectric layers and single crystalline-like silicon layers to form a plurality of bit line openings, each bit line opening extending through the alternating dielectric layers and single crystalline-like silicon layers; depositing a bit line metal in the plurality of bit line openings to form a plurality of bit lines, each bit line having a first side and a second side opposite the first side, the first side adjacent the first side of the first word line; and forming a second word line with a first side and a second side opposite the first side, by depositing a second word line metal on the plurality of pre-word line extensions on the second side of the plurality of bit lines.

In one or more embodiments, a processing tool comprises: a central transfer station comprising a robot configured to move a wafer; plurality of process stations, each process station connected to the central transfer station and providing a processing region separated from processing regions of adjacent process stations, the plurality of process stations comprising a crystallization agent deposition chamber, an annealing chamber, and a crystallization agent removal chamber; and a controller connected to the central transfer station and the plurality of process stations, the controller configured to activate the robot to move the wafer between process stations, and to control a process occurring in each of the process stations.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

FIG. 23A illustrates a cross-section view of a memory device according to one or more embodiments;

FIG. 23B illustrates a cross-section view of the memory device of FIG. 23A according to one or more alternative embodiments;

FIG. 24A illustrates a cross-section view of a memory device according to one or more alternative embodiments;

FIG. 24B illustrates a cross-section view of the memory device of FIG. 24A according to one or more alternative embodiments;

FIG. 25A illustrates a cross-section view of a memory device according to one or more alternative embodiments;

FIG. 25B illustrates a cross-section view of the memory device of FIG. 25A according to one or more alternative embodiments;

FIG. 26A illustrates a cross-section view of a memory device according to one or more alternative embodiments;

FIG. 26B illustrates a cross-section view of the memory device of FIG. 26A according to one or more alternative embodiments;

FIG. 27 illustrates a cross-section view of a memory device according to one or more alternative embodiments;

FIG. 28 illustrates a cross-section view of a memory device according to one or more alternative embodiments;

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the terms "precursor", "reactant", "reactive gas" and the like are used interchangeably to refer to any gaseous species that can react with the substrate surface.

Figure 1:
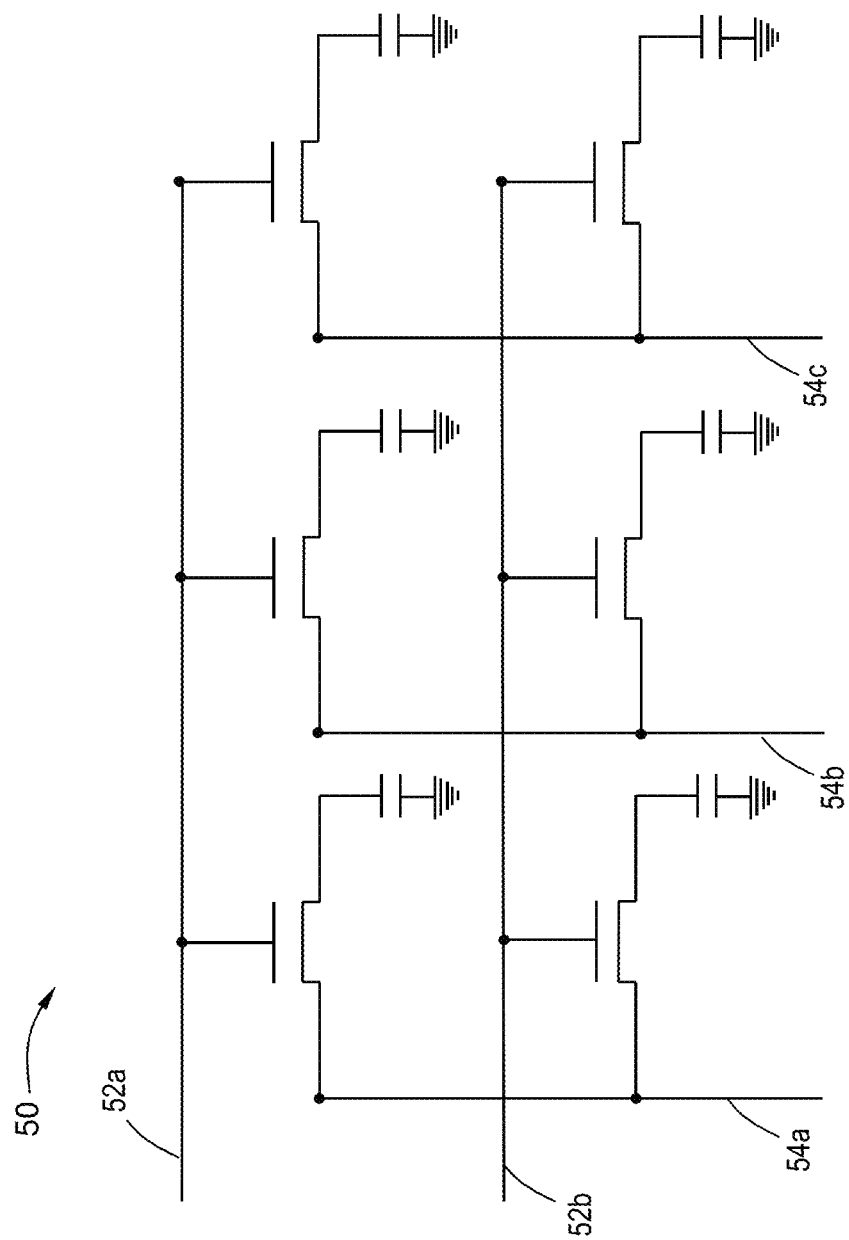
FIG. 1 illustrates a circuit diagram of a DRAM cell block in accordance with the prior art.

As used herein, the term "dynamic random access memory" or "DRAM" refers to a memory cell that stores a datum bit by storing a packet of charge (i.e., a binary one), or no charge (i.e., a binary zero) on a capacitor. The charge is gated onto the capacitor via an access transistor, and is sensed by turning on the same transistor and looking at the voltage perturbation created by dumping the charge packet on the interconnect line on the transistor output. Thus, a single DRAM cell is made of one transistor and one capacitor. The DRAM device, as illustrated in FIG. 1, is formed of an array of DRAM cells. The rows on access transistors are linked by word lines 52a, 52b, and the transistor inputs/outputs are linked by bitlines 54a, 54b, 54c. Historically, DRAM capacitors have evolved from planar polysilicon-oxide-substrate plate capacitors to 3-D structures which have diverged into "stack" capacitors with both plates above the substrate, and "trench" capacitors using an etched cavity in the substrate as the common plate.

Traditionally, DRAM cells have recessed high work-function metal structures in buried word line structure. In a DRAM device, a bitline is formed in a metal level situated above the substrate, while the word line is formed at the polysilicon gate level at the surface of the substrate. In the buried word line (bWL), a word line is buried below the surface of a semiconductor substrate using a metal as a gate electrode.

In one or more embodiments, memory devices are provided which have stacked DRAM cells, resulting in an increase in DRAM cell bit-density, which is proportional to the number of multi-pair films. The DRAM device of one or more embodiments has vertical bitlines, minimizing bitline capacitance and reducing the burden of capacitor capacitance. The DRAM device of one or more embodiments advantageously has increase mobility for highly stacked three-dimensional memory devices. Some embodiments advantageously provide DRAM devices which incorporate metal induced lateral crystallization (MILC) processing.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

Figure 2A:
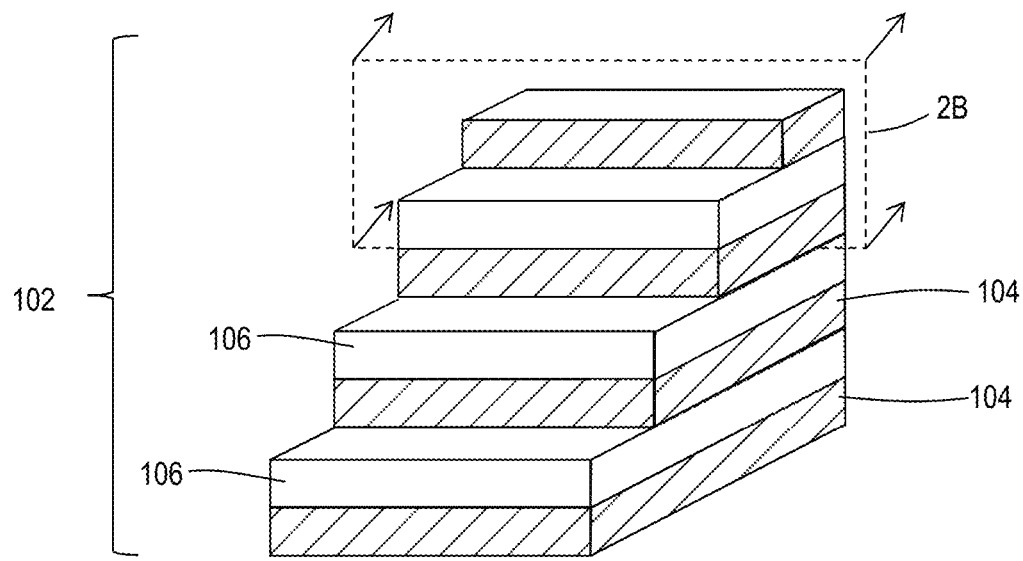
FIG. 2A illustrates an isometric view of a memory device stack after forming a staircase according to one or more embodiments.
Figure 2B:
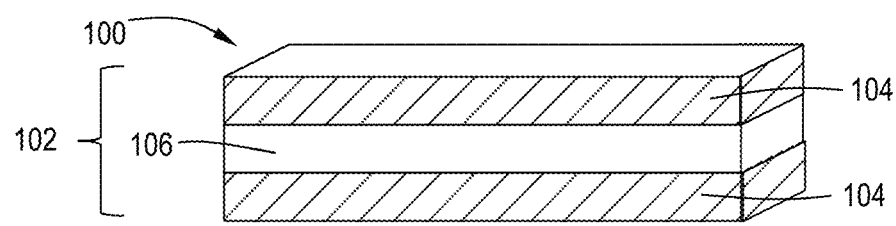
FIG. 2B illustrates a cross-section view of the memory device stack of FIG. 2A according to one or more embodiments.

FIG. 2A is an isometric view illustrating a memory device according to one or more embodiments. FIGS. 2B through 22 are cross-sectional views illustrating a memory device 100 according to one or more embodiments. Referring to FIG. 2A, a memory device 100 is formed from a staircase formation of a stack 102 of alternating dielectric layers 104 and memory layers 106. FIG. 2B is a cross-sectional view of the memory device stack of FIG. 2A. In one or more embodiments there are at least two dielectric layers 104. In one or more embodiments there are at least two memory layers 106. In other embodiments, there are from 2 to 100 dielectric layers 104 and from 2 to 100 memory layers 106. Typically, there is one more dielectric layer 104 than memory layer 106 so that the stack 102 is bounded on top and bottom by a dielectric layer 104. As recognized by one of skill in the art, while only 2 dielectric layers 104 and one memory layer 106 are depicted, a stack 102 can comprise any number of alternating dielectric layers 104 and memory layers 106.

As used herein, the term "dielectric layer" refers to a layer of material that is an electrical insulator that can be polarized in an electric field. In one or more embodiments, the dielectric layer comprises one or more of oxides, carbon doped oxides, silicon oxide (SiO), porous silicon dioxide ($SiO_2$), silicon oxide (SiO), silicon nitride (SiN), silicon oxide/silicon nitride, carbides, oxycarbides, nitrides, oxynitrides, oxycarbonitrides, polymers, phosphosilicate glass, fluorosilicate (SiOF) glass, or organosilicate glass (SiOCH).

As used herein, the term "memory layer" refers to a layer of material in which a word line can be made. In one or more embodiments, the memory layer comprises one or more of silicon, doped silicon, amorphous silicon, or poly-silicon. For example, in one or more embodiments, the memory layer is selected from one or more of amorphous silicon, poly-silicon, or IGZO (In—Ga—Zn Oxide). In some embodiments, the dielectric layer comprises a material that is etch selective relative to the memory layer.

Figure 3:
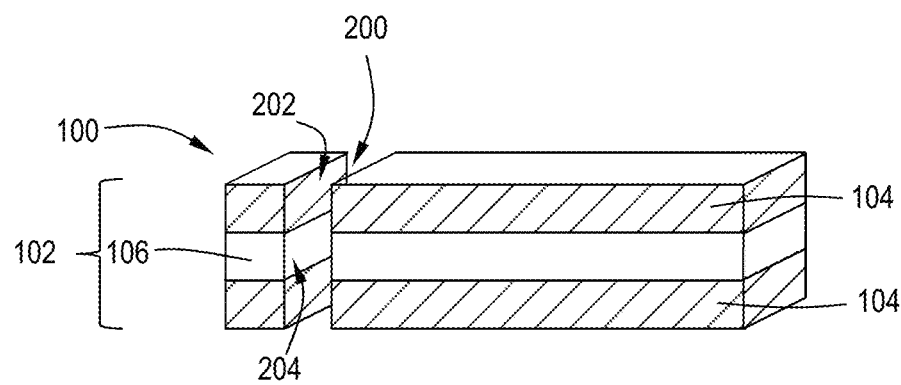
FIG. 3 illustrates a cross-section view of a memory device according to one or more embodiments.

With reference to FIG. 3, an opening 200 is opened through the stack 102. In some embodiments, opening the opening 200 comprises etching through the dielectric layers 104 and memory layer 106. The opening 200 has sidewalls that extend through the stack 102 exposing surfaces 202 of the dielectric layers 106 and exposed surfaces 204 of the memory layer 104.

Figure 4:
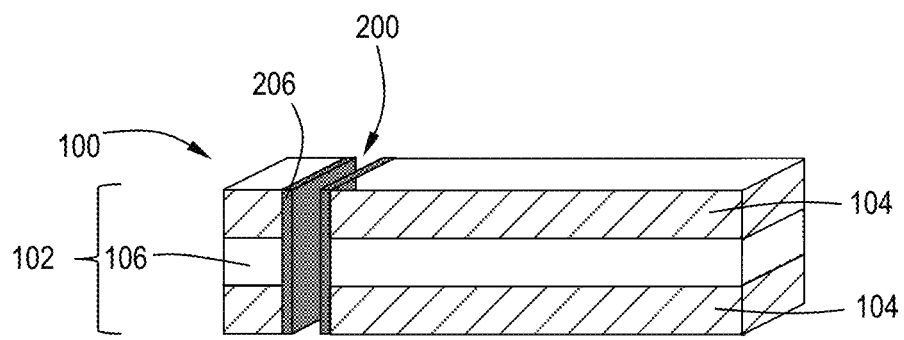
FIG. 4 illustrates a cross-section view of a memory device according to one or more embodiments.

With reference to FIG. 4, a crystallization agent 206 is deposited in the opening 200 on the exposed surfaces 202 of the dielectric layers 104 and the exposed surfaces 204 of the memory layer 106. The crystallization agent 206 can be deposited by any suitable technique known to the skilled artisan. The crystallization agent 206 includes a material that can cause the memory layer 106 to crystallize into a single crystalline-like silicon layer. As used in this manner, the term "single crystalline-like silicon" refers to a material that has greater than or equal to about 50%, 60%, 70%, 80%, 90%, 95% or 98% of the crystals oriented in the same direction relative to each other.

The crystallization agent 206 of some embodiments comprises a material having a lattice constant within ±50% of poly-silicon. In some embodiments, the crystallization agent 206 comprises one or more of nickel (Ni), chromium (Cr), cobalt (Co), palladium (Pd), germanium (Ge), aluminum (Al) or tungsten (W). In some embodiments, the crystallization agent 206 comprises or consists essentially of nickel (Ni). As used in this manner, the term "consists essentially of" means that the active component of the crystallization agent is greater than or equal to about 95%, 98%, 99% or 99.5% of the stated material.

Figure 5A:
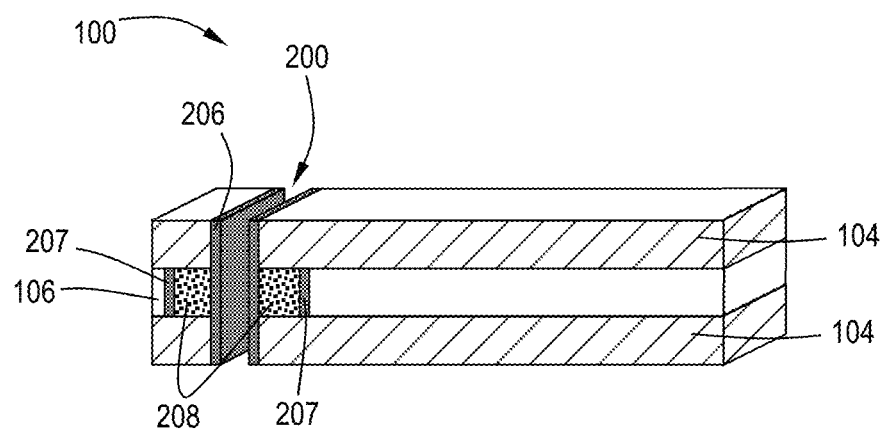
FIGS. 5A-5C illustrate cross-section views during an annealing process to crystallize the memory layer according to one or more embodiments.
Figure 5B:
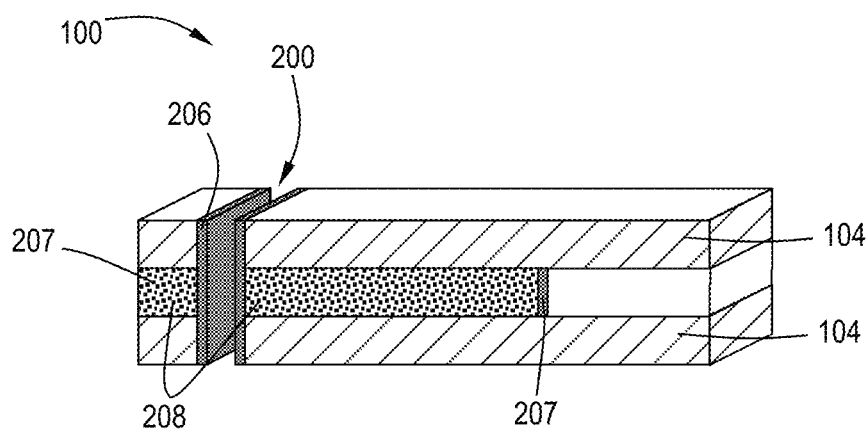
Figure 5C:
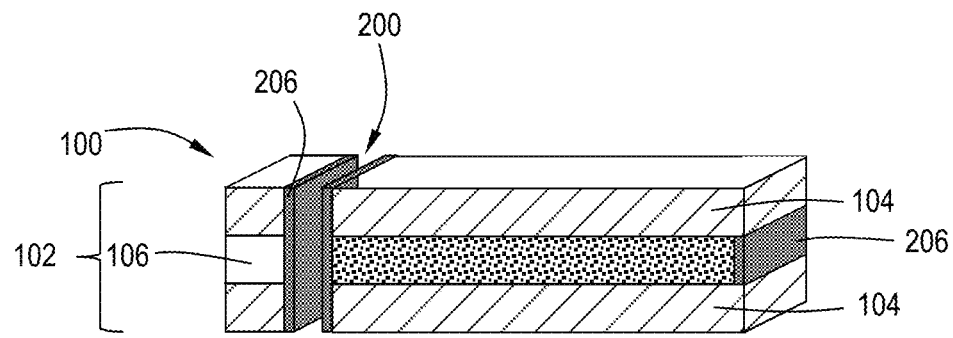

After forming the crystallization agent 206 in the opening 200 on the exposed surfaces 202 of the dielectric layers 104 and the exposed surfaces 204 of the memory layer 106, the memory device is annealed, as shown in FIGS. 5A through 5C. Annealing the memory device drives the crystallization agent 206 through the memory layer 106 to crystallize the memory layer 106 to form a single crystalline-like silicon layer 208. With the progress of annealing time, the crystallization agent/Si interface (e.g., the nickel/Si interface; also referred to as a zone 207 of crystallization agent 206) moves down and the area it has passed becomes single crystalline-like silicon layer 208. At the final stage of anneal, the interface confronts the end of the memory layer 106. The amount of crystallization agent remaining in the single crystalline-like silicon layer 208 is negligible.

Annealing the memory device can be accomplished by any suitable technique known to the skilled artisan. For example, annealing can occur in a temperature range of about 300° C. to about 700° C., in an inert atmosphere. In one or more embodiments, annealing can occur at a temperature of about 500° C.

FIG. 5A illustrates a zone 207 of crystallization agent 206 about one tenth of the length of the memory layer 106. The portion of memory layer 106 that the zone 207 of crystallization agent 206 has passed through has been converted to a single crystalline-like silicon layer 208.

FIG. 5B illustrates the memory device after the zone 207 of the crystallization agent 206 has been driven about two-thirds of the way through the length of the memory layer 106.

FIG. 5C illustrates the memory device after the zone 207 of the crystallization agent 206 has been driven more than ninety percent of the way through the length of the memory layer 106.

In some embodiments, annealing the memory device causes the crystallization agent 206 to move through the memory layer 106 at a rate in the range of about 0.5 μm/hour to about 2.5μ/hour. In one or more embodiments, the annealing takes about 0.1 to about 10 hours to complete. Amorphous silicon or poly-silicon in a memory layer has a grain boundary which hinders the path of electronic charges, resulting in degraded transistor performance. In some embodiments, annealing the memory device advantageously causes the grain size of the amorphous silicon or poly-silicon in the memory layer 106 to increase, forming the single crystalline-like silicon layer 208.

Figure 6:
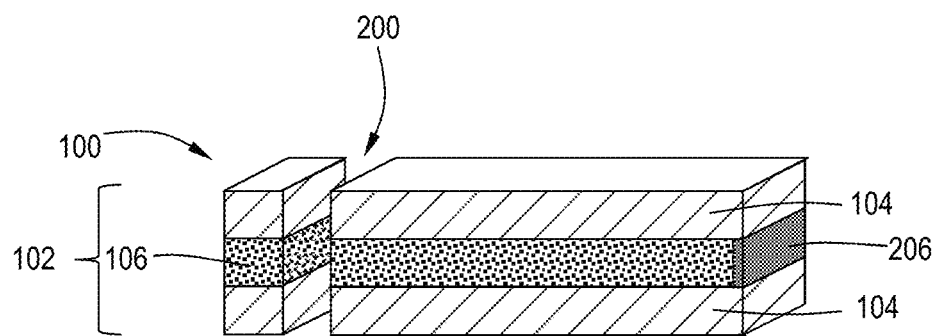
FIG. 6 illustrates a cross-section view of a memory device according to one or more embodiments.

With reference to FIG. 6, the crystallization agent 206 in the opening 200 is removed. The crystallization agent 206 can be removed by any suitable technique known to the skilled artisan. Suitable techniques include, but are not limited to, etching and chemical-mechanical planarization.

Figure 7A:
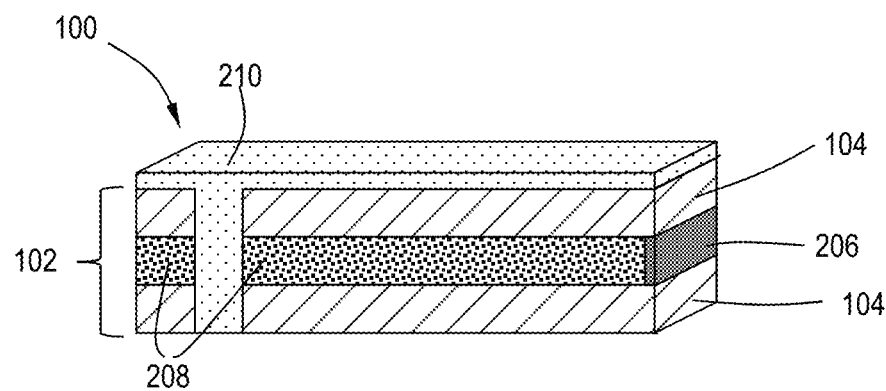
FIG. 7A illustrates a cross-section view of a memory device according to one or more embodiments.
Figure 7B:
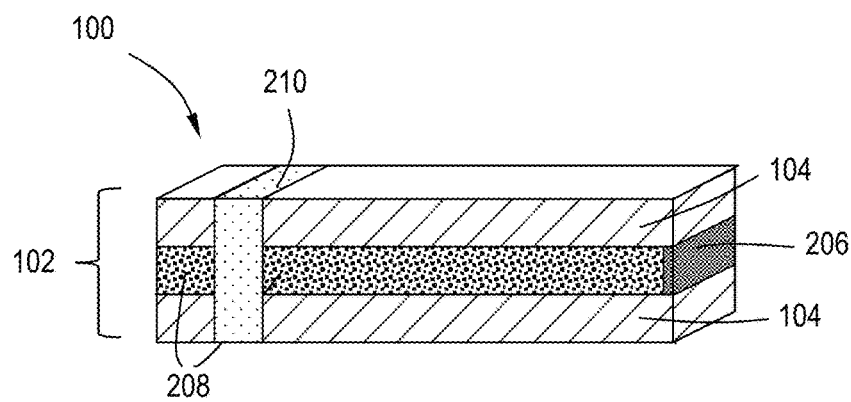
FIG. 7B illustrates a cross-section view a memory device according to one or more embodiments.

With reference to FIGS. 7A and 7B, an oxide fill 210 is deposited in opening 200, and the oxide fill 210 is planarized such that the oxide fill 210 is substantially coplanar with the top surface 211 of dielectric layer 104. In one or more embodiments, the oxide fill 210 comprises one or more of oxides, carbon doped oxides, silicon oxide (SiO), porous silicon dioxide ($SiO_2$), silicon oxide (SiO), silicon nitride (SiN), silicon oxide/silicon nitride, carbides, oxycarbides, nitrides, oxynitrides, oxycarbonitrides, polymers, phosphosilicate glass, fluorosilicate (SiOF) glass, or organosilicate glass (SiOCH). The oxide fill 210 may be deposited by any technique known to one of skill in the art, including, but not limited to, atomic layer deposition or chemical vapor deposition.

Figure 8A:
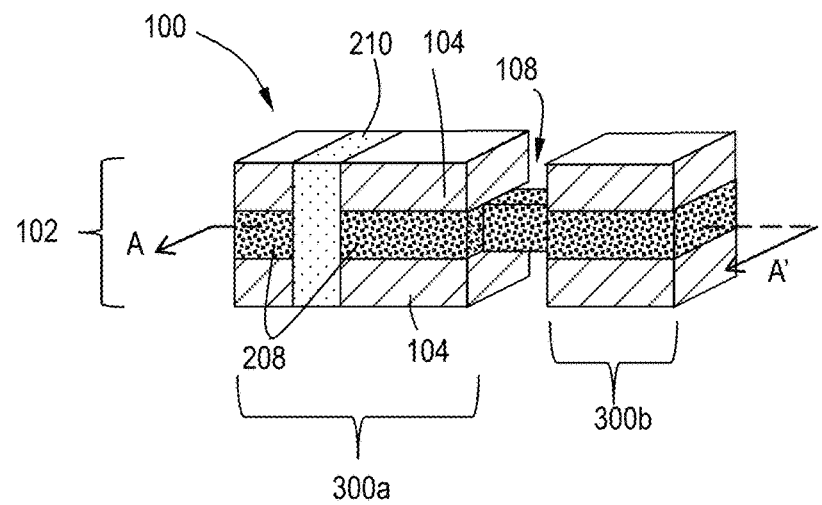
FIG. 8A illustrates a cross-section view of a memory device according to one or more embodiments.
Figure 8B:
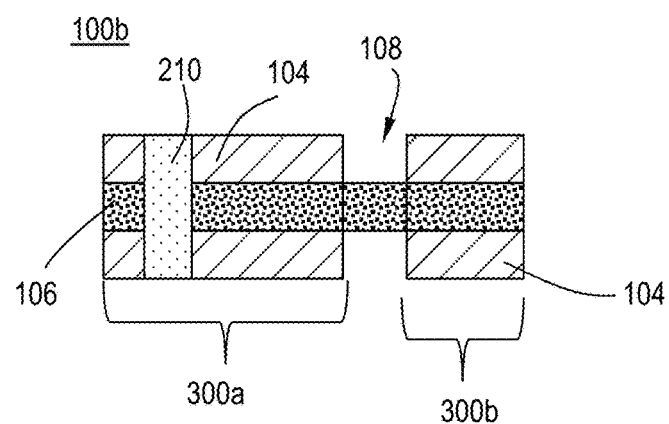
FIG. 8B illustrates a cross-section view of the memory device of FIG. 8A according to one or more embodiments.

With reference to FIGS. 8A and 8B, the crystallization agent 206 is removed by etching, and the memory device 100 is etched through the stack 102 to form a pre-word line extension 108 on at least some of, or each of the single crystalline-like silicon layer 208. As recognized by one of skill in the art, the formation of pre-word line extension 108 will create two portions in the memory device, portion 300a and portion 300b. In some embodiments, at least some of, or each of the single crystalline-like silicon layer 208 has a plurality of pre-word line extensions 108. As recognized by one of skill in the art, there may be a multitude of pre-word line extensions 108 in each single crystalline-like silicon layer 208, but, for ease of drawing, only a single pre-word line extension 108 is illustrated. FIG. 8B is a cross-section view 100b taken along axis A-A' of FIG. 8A. In one or more embodiments, the plurality of pre-word line extensions 108 are formed by etching at least one channel through the stack 102 of alternating dielectric layers 104 and single crystalline-like silicon layers 208, and selectively removing the dielectric layers 104.

In some embodiments, the at least one channel is etched through an opening in a mask (not illustrated) formed on the stack 102 followed by an anisotropic etch process.

Figure 9A:
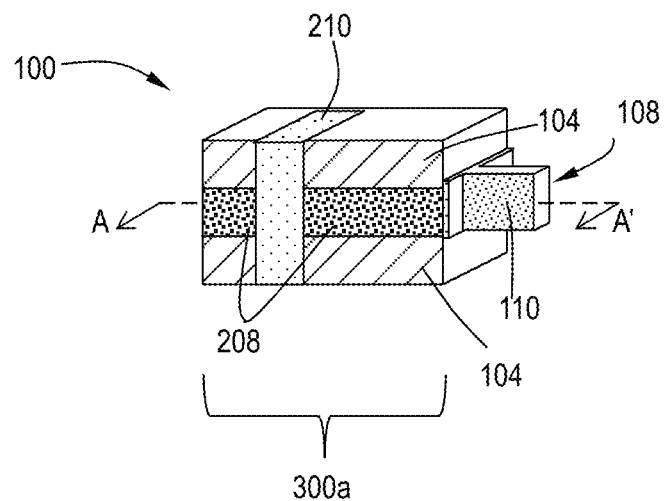
FIG. 9A illustrates a cross-section view of a memory device according to one or more embodiments.
Figure 9B:
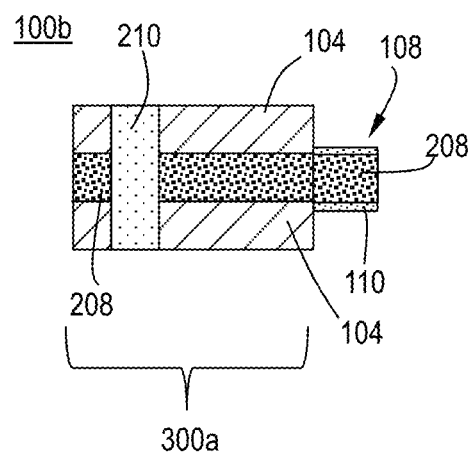
FIG. 9B illustrates a cross-section view of the memory device of FIG. 9A according to one or more embodiments.

For ease of viewing the structures contained within memory device 100, in FIGS. 9A-21, portion 300b is not illustrated. With reference to FIGS. 9A and 9B, a gate oxide layer 110 is formed on the pre-word line extension 108. FIG. 9B is a cross-section view 100b taken along axis A-A' of FIG. 9A. The illustrated embodiment shows the gate oxide layer 110 as a conformal layer with a uniform shape. However, the skilled artisan will recognize that this is merely for illustrative purposes and that the gate oxide layer 110 can form in an isotropic manner so that the gate oxide layer 110 has a rounded appearance.

In one or more embodiments, the gate oxide layer 110 comprises a gate oxide material. In one or more embodiments, the gate oxide layer 110 comprises one or more of silicon oxynitride (SiON), silicon oxide, or a high-κ dielectric material. While the term "silicon oxide" may be used to describe the gate oxide layer 110, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. The same is true for the other materials listed in this disclosure, e.g. silicon nitride, silicon oxynitride, tungsten oxide, zirconium oxide, aluminum oxide, hafnium oxide, and the like.

Figure 10A:
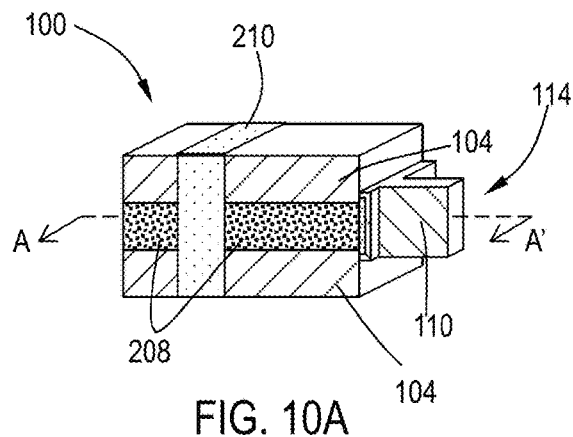
FIG. 10A illustrates a cross-section view of a memory device according to one or more embodiments.
Figure 10B:
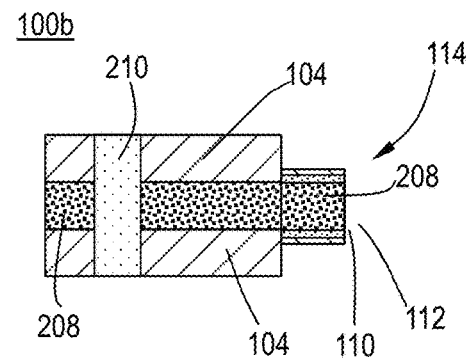
FIG. 10B illustrates a cross-section view of the memory device of FIG. 10A according to one or more embodiments.

Referring to FIGS. 10A and 10B, a word line 114 is formed by depositing a word line metal 112 on the plurality of pre-word line extensions 108 and gate oxide layers 110. FIG. 10B is a cross-section view 100b taken along axis A-A' of FIG. 10A. The illustrated embodiment shows the word line metal 112 as a conformal layer with uniform shape. However, the skilled artisan will recognize that this is merely for illustrative purposes and that the gate oxide layer 110 can form in an isotropic manner so that the gate oxide layer 110 has a rounded appearance. When the word line metal 112 is deposited on the plurality of pre-word line extensions 108, the pre-word line extensions 108 are electrically connected. In one or more embodiments, the word line metal 112 is deposited on the gate oxide layer 110. In one or more embodiments, the word line metal 112 comprises one or more of copper (Cu), cobalt (Co), tungsten (W), aluminum (Al), ruthenium (Ru), iridium (Ir), molybdenum (Mo), platinum (Pt), tantalum (Ta), titanium (Ti), or rhodium (Rh). The word line metal 112 is deposited using any one of a number of methods known to one of skill in the art, including, but not limited to, chemical vapor deposition, physical vapor deposition, or atomic layer deposition.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g. aluminum precursor) is pulsed into the reaction zone followed by a first time delay. Next, a second precursor or compound B (e.g. oxidant) is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

Plasma enhanced chemical vapor deposition (PECVD) is widely used to deposit thin films due to cost efficiency and film property versatility. In a PECVD process, for example, a hydrocarbon source, such as a gas-phase hydrocarbon or a vapor of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired film thereon. Embodiments described herein in reference to a PECVD process can be carried out using any suitable thin film deposition system. Any apparatus description described herein is illustrative and should not be construed or interpreted as limiting the scope of the embodiments described herein.

Figure 11A:
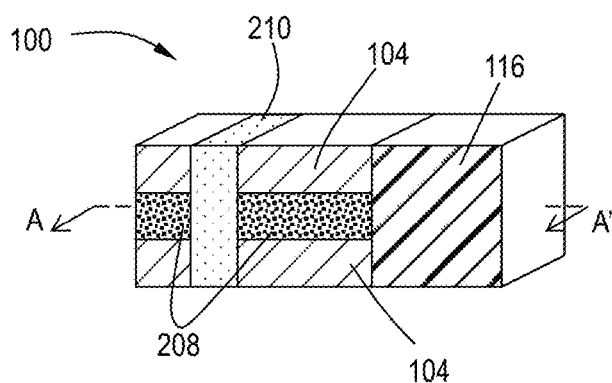
FIG. 11A illustrates a cross-section view of a memory device according to one or more embodiments.
Figure 11B:
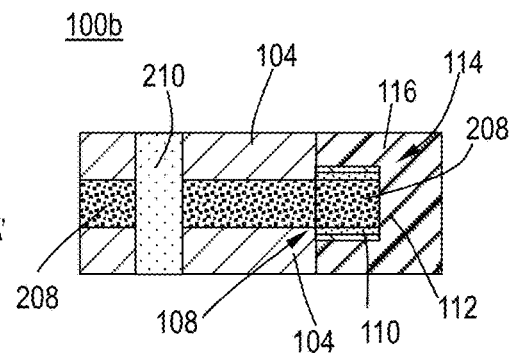
FIG. 11B illustrates a cross-section view of the memory device of FIG. 11A according to one or more embodiments.

Referring to FIGS. 11A and 11B, a dielectric material 116 is then deposited on (surrounding) the word line 114. FIG. 11B is a cross-section view 100b taken along axis A-A' of FIG. 11A. The dielectric material 116 is deposited using any one of a number of methods known to one of skill in the art, including, but not limited to, chemical vapor deposition, physical vapor deposition, or atomic layer deposition. The dielectric material 116 can be the same composition as the dielectric layers 104 or a different composition.

Figure 12A:
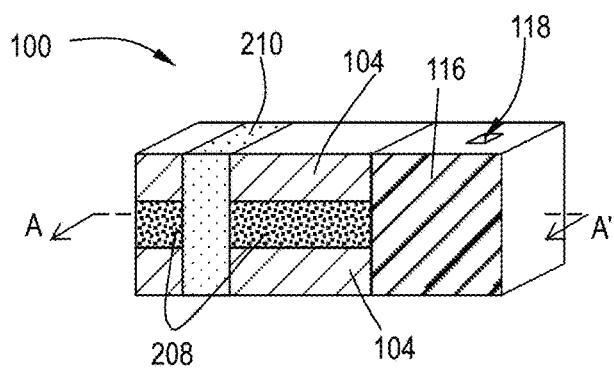
FIG. 12A illustrates a cross-section view of a memory device according to one or more embodiments.
Figure 12B:
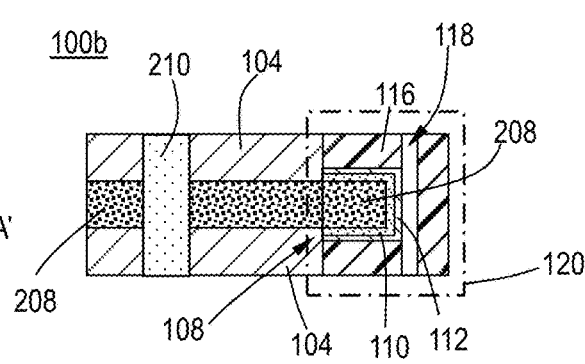
FIG. 12B illustrates a cross-section view of the memory device of FIG. 12A according to one or more embodiments.
Figure 12C:
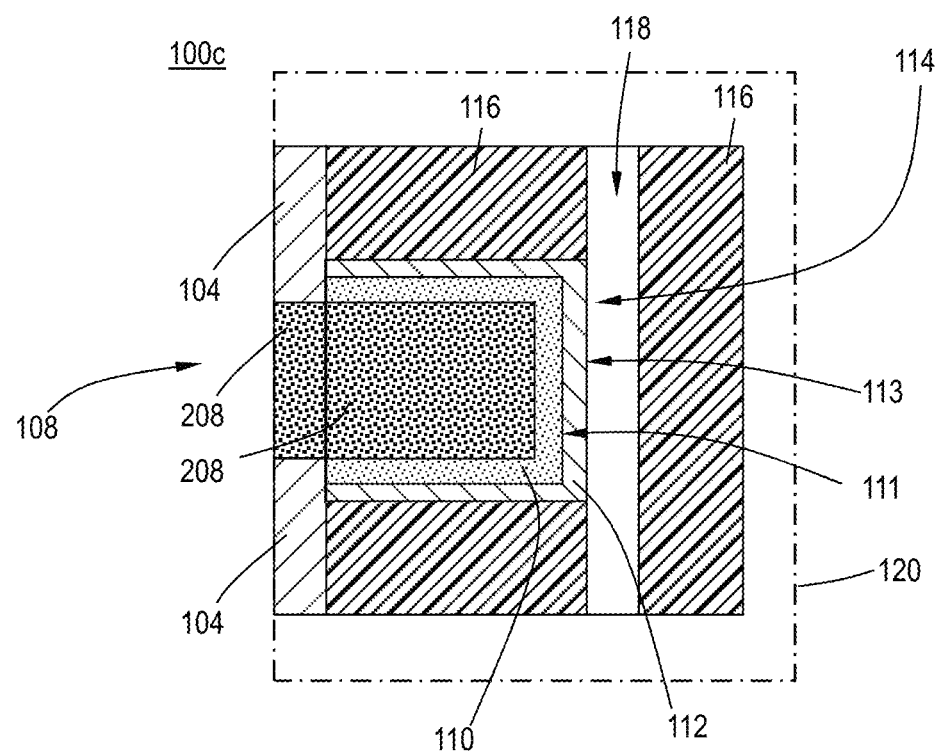
FIG. 12C illustrates an expanded cross-section view of the memory device of FIG. 12B according to one or more embodiments.

Referring to FIGS. 12A-12C, the alternating dielectric layers 104 and single crystalline-like silicon layers 208 with a plurality of word lines 114 are then patterned to form a plurality of bit line openings 118. In one or more embodiments, each bit line opening 118 extends through the alternating dielectric layers 104 and single crystalline-like silicon layers 208. FIG. 12B is a cross-section view 100b taken along axis A-A' of FIG. 12A. FIG. 12C is an expanded view 100c of the area/square 120 in FIG. 7B.

Figure 13:
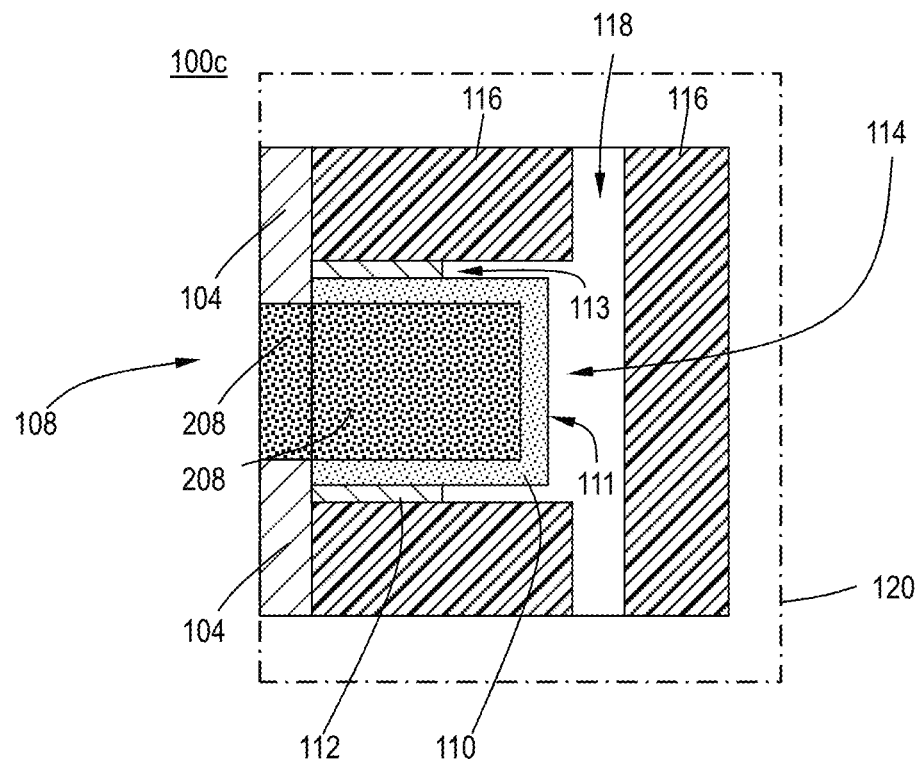
FIG. 13 illustrates an expanded cross-section view of a memory device according to one or more embodiments.

Referring to FIG. 13, which is an expanded view 100c of the area/square 120 in FIG. 12B, the word line metal 112 is recessed. Recessing of the word line metal 112 can be done by any suitable technique known to the skilled artisan. Recessing the word line metal 112 causes the top surface 113 of the word line metal 112 to be lower than the top surface 111 of the gate oxide layer 110. Recessing the word line metal 112 exposes the top surface 111 of the gate oxide layer 110 to the bit line opening 118.

Figure 14:
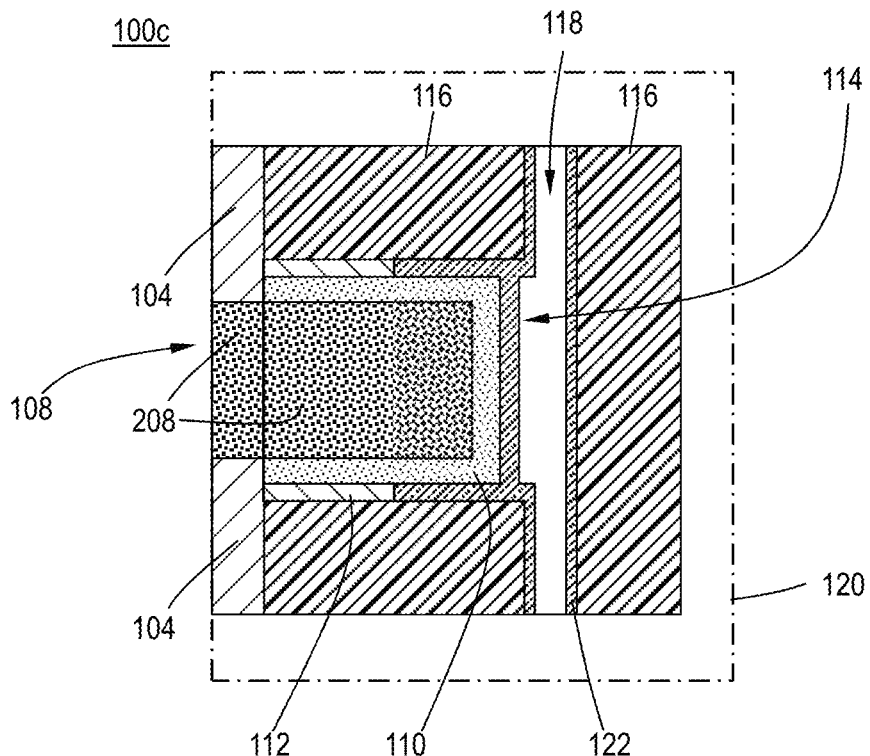
FIG. 14 illustrates an expanded cross-section view of a memory device according to one or more embodiments.

Referring to FIG. 14, which is an expanded view 100c of the area/square 120 in FIG. 12B, an oxide 122 is conformally deposited in the plurality of bit line openings 118 and deposited on an exposed surface of the dielectric material 116 and on the gate oxide layer 110. In one or more embodiments, the oxide 122 may comprise any suitable oxidic material known to one of skill in the art. In the illustrated embodiment, the oxide 122 is selectively deposited on the dielectric material relative to the gate oxide layer 110. In some embodiments, the oxide 122 is deposited on the gate oxide layer 110 and the dielectric material.

Figure 15:
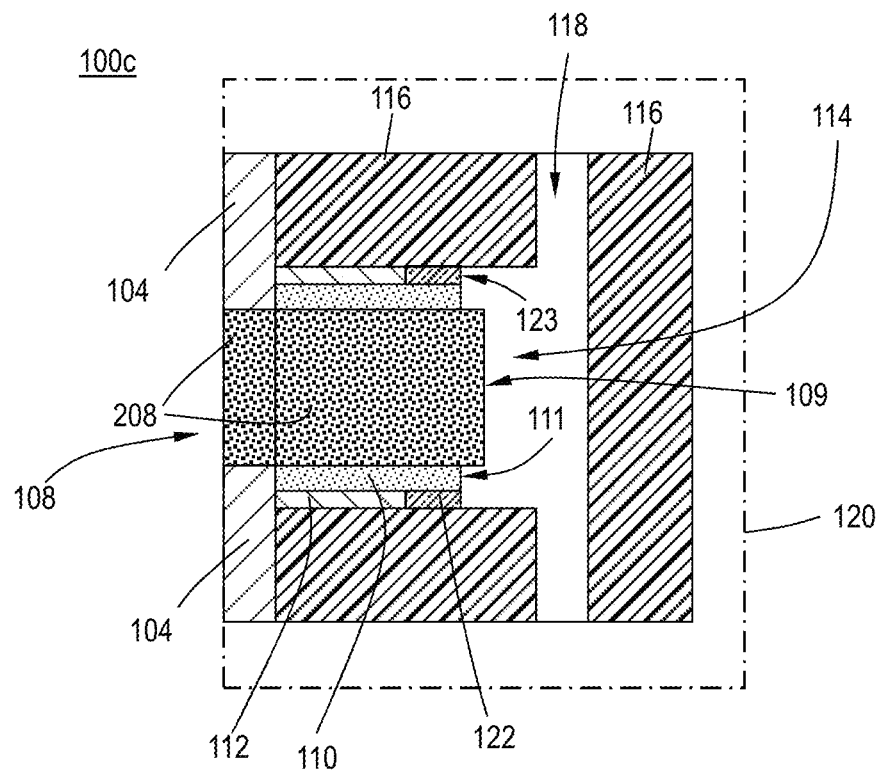
FIG. 15 illustrates an expanded cross-section view of a memory device according to one or more embodiments.

Referring to FIG. 15, which is an expanded view 100c of the area/square 120 in FIG. 12B, the oxide 122 is selectively removed such that only a portion of the oxide remains adjacent to the word line metal 112 and the gate oxide layer 110. When the oxide 122 is selectively removed, a portion of the gate oxide layer 110 on the pre-word line extension 108 is also removed, leaving a portion of the pre-word line extension 108 exposed in the bit line opening 118. The oxide 122 is selectively removed using any one of a number of methods known to one of skill in the art, including, but not limited to, chemical mechanical polishing (CMP), etching, or the like. In the illustrated embodiment, the oxide 122 and gate oxide layer 110 are removed so that the top surface 123 of the oxide 122 and the top surface 111 of the gate oxide layer 110 are recessed about the same amount below the top surface 109 of the pre-word line extension 108.

Figure 16:
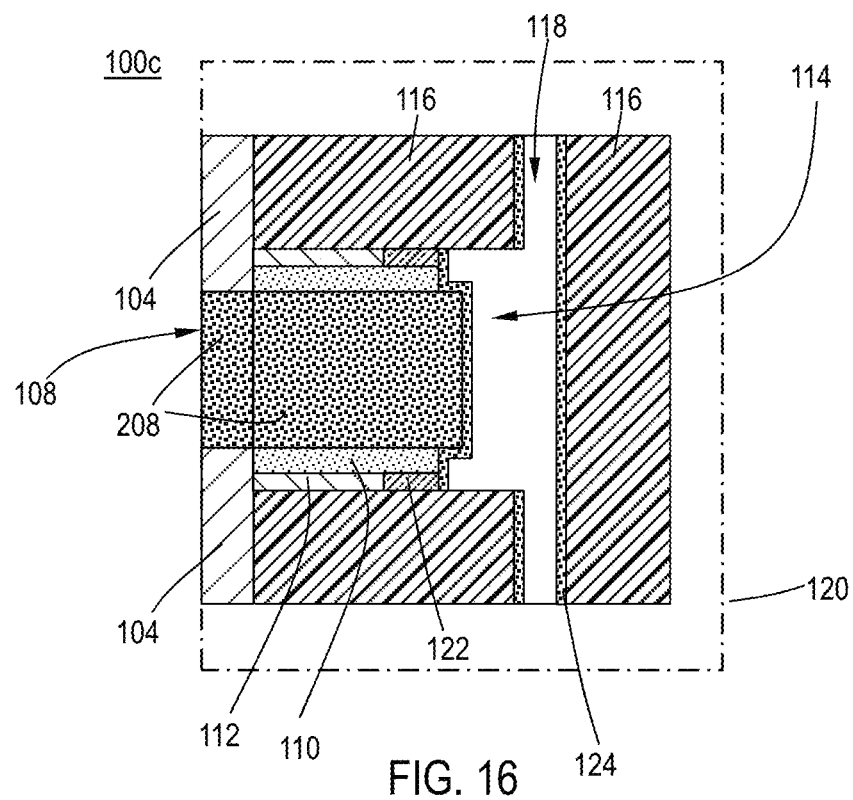
FIG. 16 illustrates an expanded cross-section view of a memory device according to one or more embodiments.

Referring to FIG. 16, which is an expanded view 100c of the area/square 120 in FIG. 12B, a liner 124 is conformally deposited in the plurality of bit line openings 118 and deposited on an exposed surface of the dielectric material 116, the gate oxide layer 110, the pre-word line extension 108, and the oxide 122. The liner 124 can be deposited by any suitable technique known to the skilled artisan. The liner 124 can be any suitable material including, but not limited to, titanium nitride (TiN) or tantalum nitride (TaN).

Figure 17:
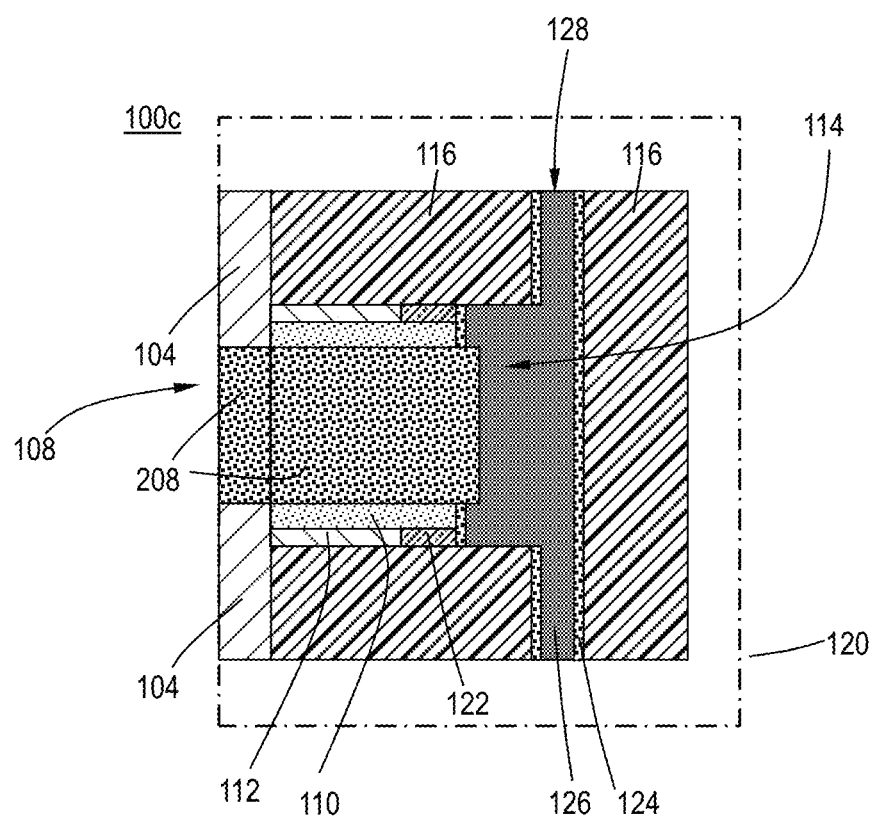
FIG. 17 illustrates an expanded cross-section view of a memory device according to one or more embodiments.

Referring to FIG. 17, which is an expanded view 100c of the area/square 120 in FIG. 12B, a bit line metal 126 is deposited in the plurality of bit line openings 118 to form the bit line 128. In one or more embodiments, the bit line metal 126 comprises one or more of WSi, WN, or W. The bit line metal 126 can be deposited by any suitable technique known to the skilled artisan and can be any suitable material. In one or more embodiments, forming the word line 114 further comprises forming a bit line metal seed layer on the oxide layer 122 prior to depositing the bit line metal 128.

Figures 18A, 18B:
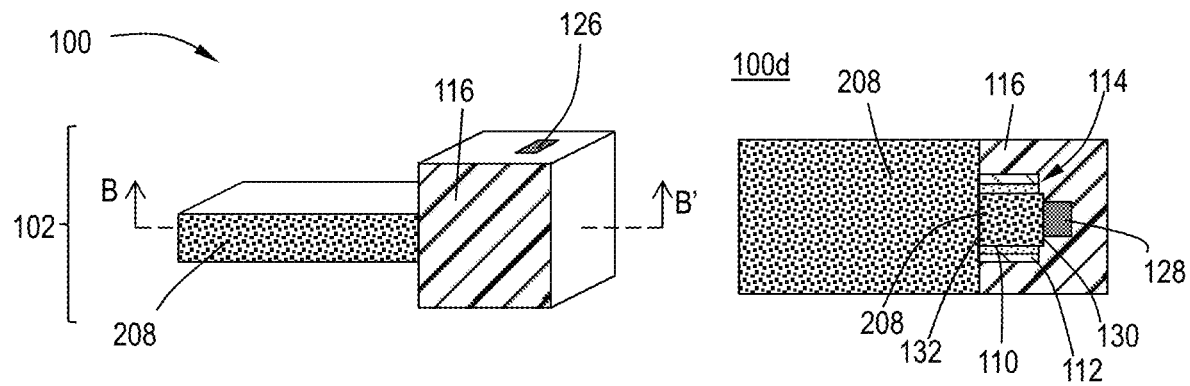
FIG. 18A illustrates a cross-section view of a memory device according to one or more embodiments.
FIG. 18B illustrates a cross-section view of the memory device of FIG. 18A according to one or more embodiments.

With reference to FIGS. 18A and 18B, the memory device 100 is illustrated with dielectric layers 104 removed for ease of visualization. FIG. 18B is a cross-section view 100d taken along axis B-B' of FIG. 18A. The stack 102 has at least one bit line 128 extending through the alternating dielectric layers (removed for ease of visualization) and single crystalline-like silicon layers 208. Each single crystalline-like silicon layer 208 has at least one word line 114 that comprises a pre-word line extension 108, a gate oxide layer 110 and a first metal layer 112. The at least one word line 114 has a first side 130 adjacent the bit line 128 and a second side 132 opposite the first side 130.

Figures 19A, 19B:
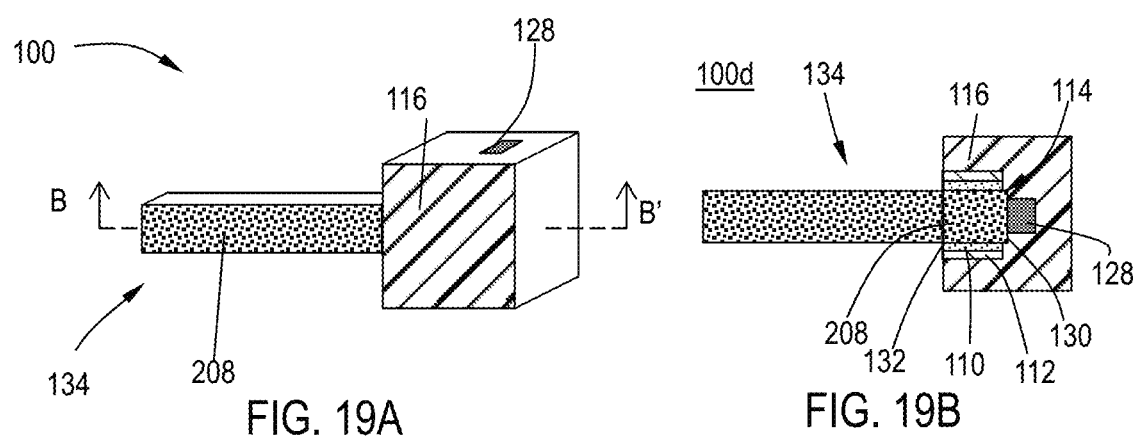
FIG. 19A illustrates a cross-section view of a memory device according to one or more embodiments.
FIG. 19B illustrates a cross-section view of the memory device of FIG. 19A according to one or more embodiments.

Referring to FIGS. 19A and 19B, at least one pre-capacitor extension 134 is formed in the single crystalline-like silicon layers 208. FIG. 19B is a cross-section view 100d taken along axis B-B' of FIG. 19A. The pre-capacitor extension 134 is in contact with the second side 132 of the word line 114. In one or more embodiments, forming the at least one pre-capacitor extension 134 in the single crystalline-like silicon layers 208 comprises forming a mask layer (not illustrated) on the single crystalline-like silicon layers 208, and etching the single crystalline-like silicon layers 208 through the mask layer to form the pre-capacitor extension 134. In one or more embodiments, the method further comprises selectively removing a portion of the dielectric layers 104 (not illustrated for ease of visualization) and doping the pre-capacitor extension 134 to form a bottom electrode.

Figure 20:
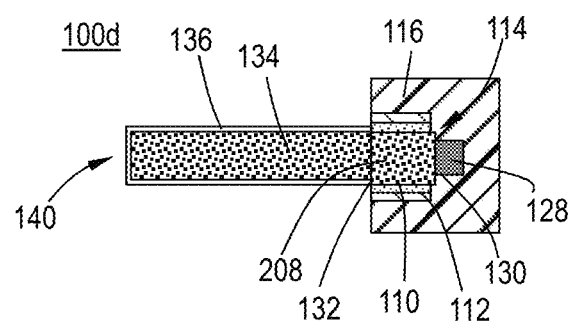
FIG. 20 illustrates a cross-section view of a memory device according to one or more embodiments.

In FIG. 20, which is a cross-section view taken along axis B-B' of FIG. 19A, the at least one pre-capacitor extension 134 is formed into a capacitor 140 by first depositing a high-κ dielectric 136 on the pre-capacitor extension 134. In one or more embodiments, the term "high-κ dielectric" refers to a material with a high dielectric constant (as compared to, e.g. silicon dioxide). In one or more embodiments, the high-κ dielectric material is selected from one or more of hafnium oxide ($HfO_2$), zirconium oxide ($ZrO_2$), vanadium oxide ($VO_2$), titanium oxide ($TiO_2$), tin oxide ($SnO_2$), aluminum oxide ($Al_2O_3$), zinc oxide (ZnO), hafnium silicon oxide (HfSiO), zirconium silicon oxide (ZrSiO), or niobium oxide ($Nb_2O_5$).

Figure 21:
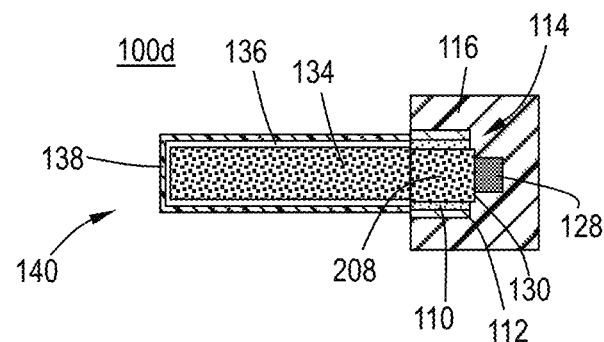
FIG. 21 illustrates a cross-section view of a memory device according to one or more embodiments.

In FIG. 21, which is a cross-section view taken along axis B-B' of FIG. 19A, the capacitor 140 is formed by first depositing a top contact 138 on the high-κ dielectric 136 on the pre-capacitor extension 134. In one or more embodiments, the top contact 138 can be any suitable material known to the skilled artisan. In one or more embodiments, the top contact 138 is selected from one or more of nitrogen (N), copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt).

Figure 22:
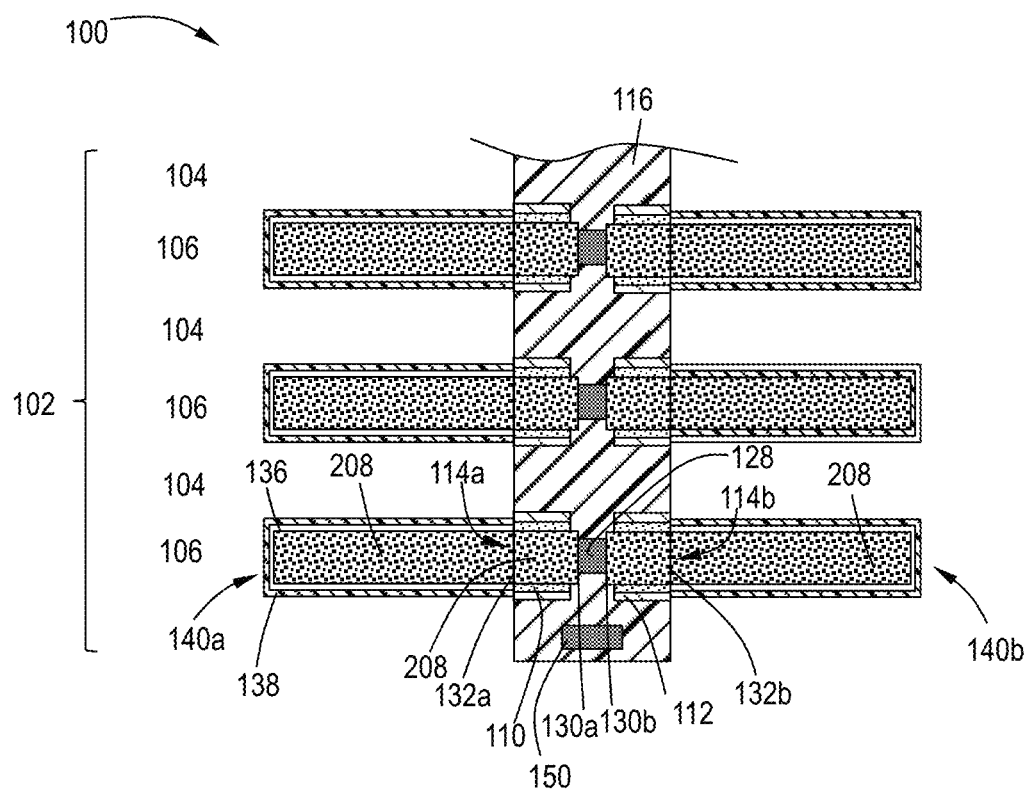
FIG. 22 illustrates a cross-section view of a memory device according to one or more embodiments.

Referring to FIG. 22, one or more embodiments provide a memory device 100 comprising a plurality of bit lines 128 extending through a stack 102 of alternating memory layers 106 and dielectric layers 104. In one or more embodiments, each of the memory layers 106 comprise a single crystalline-like silicon layer 208, a first word line 114a having a first side 130 adjacent a first side of the plurality of bit lines 128 and a second side 132 opposite the first side 130, a second word line 114b having a first side 130b adjacent a second side of the plurality of bit lines 128 and a second side 132b opposite the first side 130b, and at least one first capacitor 140 adjacent the second side 132a of the first word line 114a, and at least one second capacitor 140b adjacent the second side 132b of the second word line 114b. In one or more embodiments, the first word line 114a and the second word line 114b independently comprise a pre-word line extension 108 comprising a single crystalline-like silicon layer 208, a gate oxide layer 110 and a first metal layer 112. In one or more embodiments, the gate oxide layer 110 comprises a gate oxide material. In one or more embodiments, the gate oxide layer 110 comprises one or more of silicon oxynitride (SiON), silicon oxide, or a high-κ dielectric material. In one or more embodiments, the word line first metal layer 112 comprises one or more of copper (Cu), cobalt (Co), tungsten (W), aluminum (Al), ruthenium (Ru), iridium (Ir), molybdenum (Mo), platinum (Pt), tantalum (Ta), titanium (Ti), or rhodium (Rh). The word line metal 112 is deposited using any one of a number of methods known to one of skill in the art, including, but not limited to, chemical vapor deposition, physical vapor deposition, or atomic layer deposition.

In one or more embodiments, the plurality of bit lines 128 comprise one or more of WSi, WN, or W. In one or more embodiments, the at least one first capacitor 140a and the at least one second capacitor 140b independently comprise one or more of a high-κ dielectric or a metal layer comprising one or more of copper (Cu), cobalt (Co), tungsten (W), aluminum (Al), ruthenium (Ru), iridium (Ir), molybdenum (Mo), platinum (Pt), tantalum (Ta), titanium (Ti), or rhodium (Rh).

In one or more embodiments, the first word line 114a and the second word line 114b independently comprise one or more of a gate oxide layer 136 or a top contact 138. In one or more embodiments, the gate oxide layer 136 comprises one or more of silicon oxynitride (SiON), silicon oxide (SiO), or a high-κ dielectric material. In one or more embodiments, the top contact 138 comprises one or more of nitrogen (N), copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt).

In one or more embodiments, the memory device 100 comprises at least one first word line contact 150 in electrical communication with the first word line 114a and at least one second word line contact in electrical communication with the second word line 114b. In one or more embodiments, the at least one first word line contact and the at least one second word line contact extend through the alternating memory layers 106 comprising a single crystalline-like silicon layer 208 and dielectric layers 104 a distance sufficient to terminate at one of the first word line 114a or second word line 114b, respectively.

FIGS. 23A-28 provide one or more alternative embodiments. Referring to FIGS. 23A and 23B, which are the same as FIGS. 19A and 19B except dotted lines are drawn to illustrate dielectric layers 104, at least one pre-capacitor extension 134 is formed in the single crystalline-like silicon layers 208. FIG. 23B is a cross-section view 100d taken along axis B-B' of FIG. 23A. The pre-capacitor extension 134 is in contact with the second side 132 of the word line 114. In one or more embodiments, forming the at least one pre-capacitor extension 134 in the single crystalline-like silicon layers 208 comprises forming a mask layer (not illustrated) on the single crystalline-like silicon layers 208, and etching the single crystalline-like silicon layers 208 through the mask layer to form the pre-capacitor extension 134. In one or more embodiments, the method further comprises selectively removing a portion of the dielectric layers 104 and doping the pre-capacitor extension 134 to form a bottom electrode.

In FIGS. 24A and 24B, the single crystalline-like silicon layer 208 is conformally doped to form highly doped silicon layer 212. For example, in one or more embodiments, after removing a portion of single crystalline-like silicon layer 208 to form the pre-capacitor extension 132, the remaining single crystalline-like silicon layer 208 can be doped by PLAD (PLAsma doping) or gas phase doping in a gas ambient with phosphorus (P) or arsenic (As). FIG. 24B is a cross-section view 100d taken along axis B-B' of FIG. 24A. The single crystalline-like silicon layer 208 remains in the word line 114.

With reference to FIGS. 25A and 25B, the highly doped silicon layer 212 is recessed forming a recess 213. FIG. 25B is a cross-section view 100d taken along axis B-B' of FIG. 25A. In one or more embodiments, the highly doped silicon layer 212 is recess etched. The recess depth is controlled to prevent etching of the word line 114, and thus, a small portion of the highly doped silicon layer 212 remains adjacent the second side 132 of the word line 114.

Referring to FIGS. 26A and 26B, a metal is deposited through opening 213 to form a second metal material 214. In one or more embodiments, the metal material 214 may be deposited by any technique known to one of skill in the art, including, but not limited to, physical vapor deposition, atomic layer deposition, or chemical vapor deposition. In one or more embodiments, the metal material 214 comprises one or more metal selected from copper (Cu), cobalt (Co), tungsten (W), aluminum (Al), ruthenium (Ru), iridium (Ir), molybdenum (Mo), platinum (Pt), tantalum (Ta), titanium (Ti), or rhodium (Rh), and the like.

In other embodiments, a metal is deposited through opening 213 to form a metal nitride material 214. In one or more embodiments, the metal nitride material 214 may be deposited by any technique known to one of skill in the art, including but not limited to physical vapor deposition, atomic layer deposition, or chemical vapor deposition. In one or more embodiments, the nitride metal nitride material 214 comprises one or more metal nitride selected from titanium nitride (TiN), titanium silicon nitride (TiSiN), tantalum nitride (TaN), tantalum silicon nitride (TaSiN), tungsten nitride (WN), tungsten silicon nitride (WSiN), and the like.

With reference to FIG. 27, which is a cross-section view taken along axis B-B' of FIG. 26A, at least one pre-capacitor extension 134 is formed into a capacitor 140 by first depositing a high-κ dielectric 136 on the pre-capacitor extension 134 comprising a second metal material 214 and a highly doped silicon 212. In one or more embodiments, the term "high-κ dielectric" refers to a material with a high dielectric constant (as compared to, e.g. silicon dioxide). In one or more embodiments, the high-κ dielectric material is selected from one or more of hafnium oxide ($HfO_2$), zirconium oxide ($ZrO_2$), vanadium oxide ($VO_2$), titanium oxide ($TiO_2$), tin oxide ($SnO_2$), aluminum oxide ($Al_2O_3$), zinc oxide (ZnO), hafnium silicon oxide (HfSiO), or zirconium silicon oxide (ZrSiO), or niobium oxide ($Nb_2O_5$).

In FIG. 28, which is a cross-section view taken along axis B-B' of FIG. 26A, the capacitor 140 is formed by first depositing a top contact 138 on the high-κ dielectric 136 on the pre-capacitor extension 134 comprising a second metal material 214 and a highly doped silicon 212. In one or more embodiments, the top contact 138 can be any suitable material known to the skilled artisan. In one or more embodiments, the top contact 138 is selected from one or more of nitrogen (N), copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt).

Figure 29:
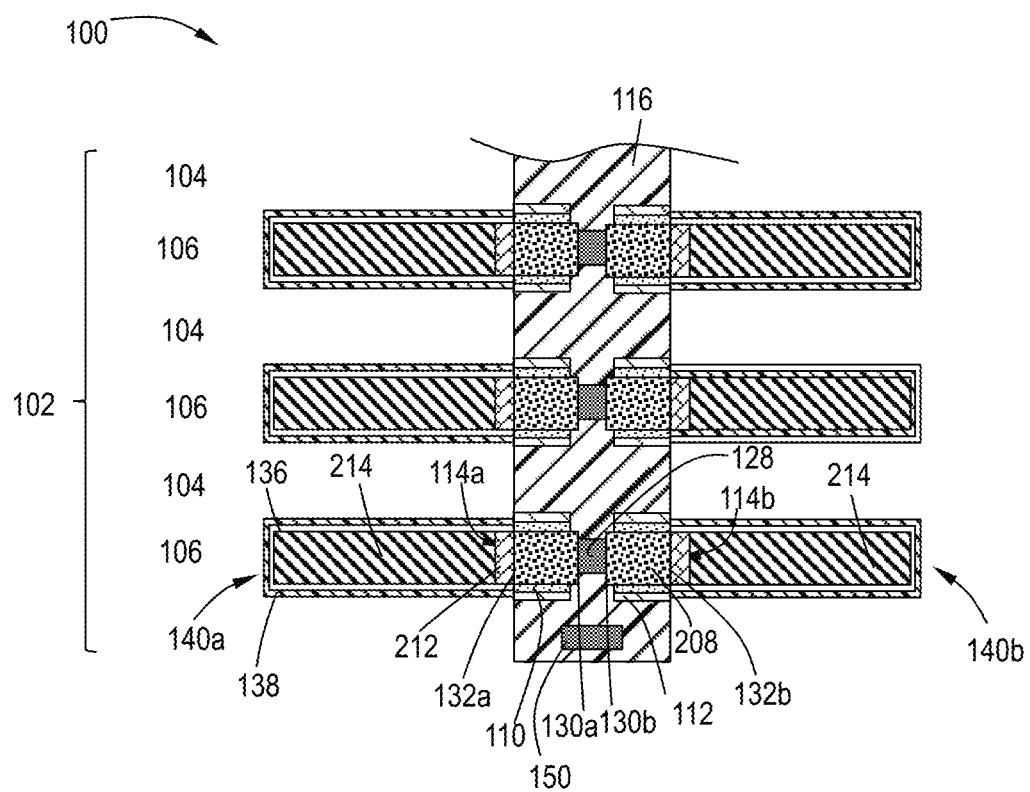
FIG. 29 illustrates a cross-section view of a memory device according to one or more alternative embodiments.

Referring to FIG. 29, one or more embodiments provide a memory device 100 comprising a plurality of bit lines 128 extending through a stack 102 of alternating memory layers 106 and dielectric layers 104. In one or more embodiments, each of the memory layers 106 comprise a single crystalline-like silicon layer 208, a metal nitride material 214, and a highly doped silicon 212. Each of the memory layers 106 comprise a first word line 114a comprising a single crystalline-like silicon layer 208 and having a first side 130 adjacent a first side of the plurality of bit lines 128 and a second side 132 opposite the first side 130, a second word line 114b comprising a single crystalline-like silicon layer 208 and having a first side 130b adjacent a second side of the plurality of bit lines 128 and a second side 132b opposite the first side 130b, and at least one first capacitor 140 comprising a metal nitride material 214 and a highly doped silicon 212, the at least one first capacitor 140 adjacent the second side 132a of the first word line 114a, and at least one second capacitor 140b comprising a metal nitride material 214 and a highly doped silicon 212, the at least one second capacitor 140b adjacent the second side 132b of the second word line 114b. In one or more embodiments, the second metal nitride material 214 comprises one or more metal selected from titanium nitride (TiN), titanium silicon nitride (TiSiN), tantalum nitride (TaN), tantalum silicon nitride (TaSiN), tungsten nitride (WN), tungsten silicon nitride (WSiN), and the like.

In one or more embodiments, the first word line 114a and the second word line 114b independently comprise a pre-word line extension 108 comprising a single crystalline-like silicon layer 208, a gate oxide layer 110 and a first metal layer 112. In one or more embodiments, the gate oxide layer 110 comprises a gate oxide material. In one or more embodiments, the gate oxide layer 110 comprises one or more of silicon oxynitride (SiON), silicon oxide, or a high-κ dielectric material. In one or more embodiments, the word line first metal layer 112 comprises one or more of copper (Cu), cobalt (Co), tungsten (W), aluminum (Al), ruthenium (Ru), iridium (Ir), molybdenum (Mo), platinum (Pt), tantalum (Ta), titanium (Ti), or rhodium (Rh). The word line metal 112 is deposited using any one of a number of methods known to one of skill in the art, including, but not limited to, chemical vapor deposition, physical vapor deposition, or atomic layer deposition.

In one or more embodiments, the plurality of bit lines 128 comprise one or more of WSi, WN, or W. In one or more embodiments, the at least one first capacitor 140a and the at least one second capacitor 140b independently comprise one or more of a high-κ dielectric or a metal layer comprising one or more of copper (Cu), cobalt (Co), tungsten (W), aluminum (Al), ruthenium (Ru), iridium (Ir), molybdenum (Mo), platinum (Pt), tantalum (Ta), titanium (Ti), or rhodium (Rh).

In one or more embodiments, the first word line 114a and the second word line 114b independently comprise one or more of a gate oxide layer 136 or a top contact 138. In one or more embodiments, the gate oxide layer 136 comprises one or more of silicon oxynitride (SiON), silicon oxide (SiO), or a high-κ dielectric material. In one or more embodiments, the top contact 138 comprises one or more of nitrogen (N), copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt).

In one or more embodiments, the memory device 100 comprises at least one first word line contact 150 in electrical communication with the first word line 114a and at least one second word line contact in electrical communication with the second word line 114b. In one or more embodiments, the at least one first word line contact and the at least one second word line contact extend through the alternating memory layers 106 comprising a single crystalline-like silicon layer 208 and dielectric layers 104 a distance sufficient to terminate at one of the first word line 114a or second word line 114b, respectively.

Figure 30:
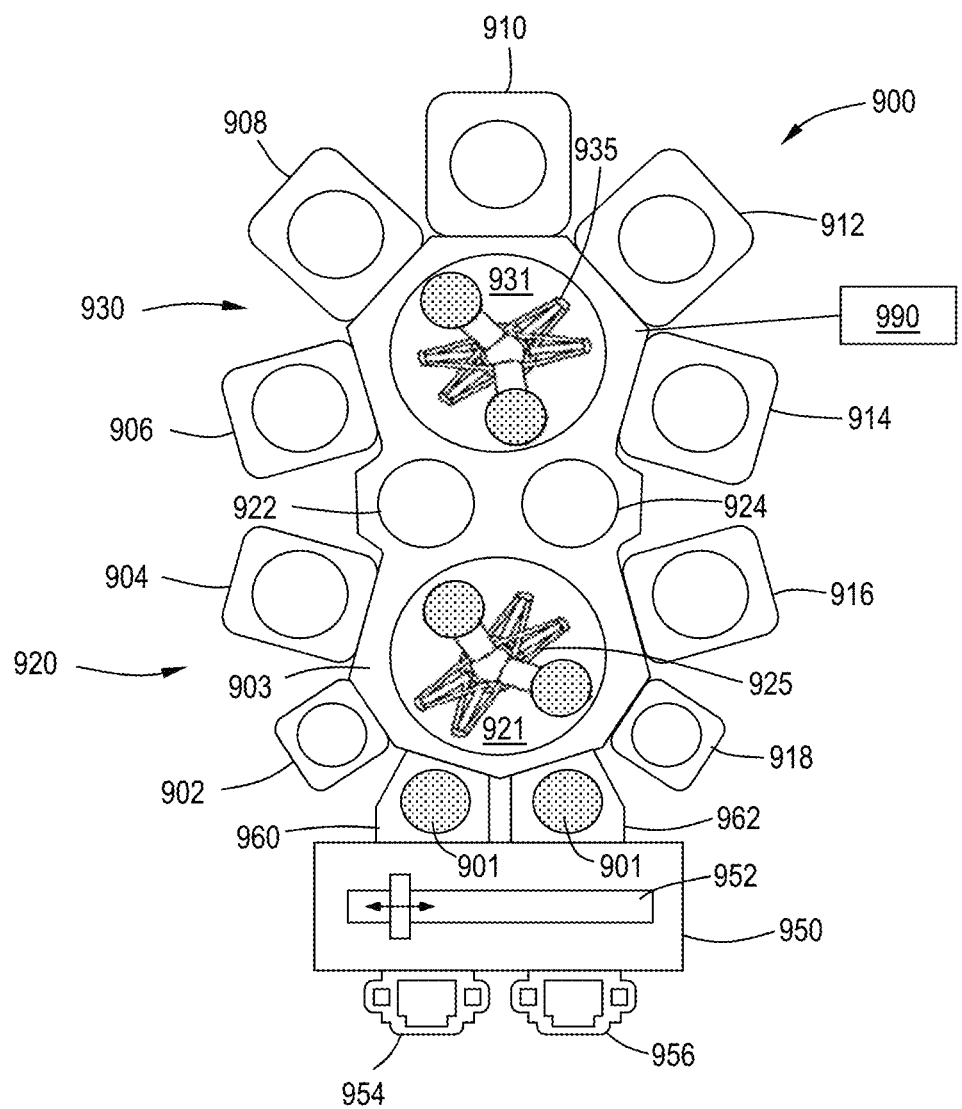
FIG. 30 illustrates a cluster tool according to one or more embodiments.

Additional embodiments of the disclosure are directed to processing tools 900 for the formation of the memory devices and methods described, as shown in FIG. 30.

The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber and crystallization agent removal chamber. The particular arrangement of process chambers and components can be varied depending on the cluster tool and should not be taken as limiting the scope of the disclosure.

In some embodiments, the cluster tool 900 includes a crystallization agent deposition chamber. The crystallization agent deposition chamber of some embodiments comprises one or more of an atomic layer deposition chamber, a plasma enhanced atomic layer deposition chamber, a chemical vapor deposition chamber, a plasma enhanced chemical vapor deposition chamber or a physical deposition chamber. In some embodiments, the cluster tool 900 includes a pre-cleaning chamber connected to the central transfer station.

In the embodiment shown in FIG. 30, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In some embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the system controller 990 has a configuration to control the annealing chamber to anneal a wafer at a temperature in the range of about 300° C. to about 700° C. for a time the range of about 0.1 to about 12 hours. In some embodiments, the controller 990 has a configuration to activate the pre-cleaning chamber to remove an oxide layer from the wafer.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a memory device, the method comprising:
    forming an opening extending through a stack of alternating dielectric layers and memory layers;
    depositing a crystallizing agent into the opening;
    crystallizing the memory layers to form single crystalline-like silicon layers, wherein the single crystalline-like silicon layers are formed by is formed by metal induced lateral crystallization processing and comprise a material that has greater than or equal to about 50% of the crystals oriented in the same direction relative to each other;
    forming a plurality of pre-word line extensions by etching at least one channel through the stack of alternating dielectric layers and single crystalline-like silicon layers, and selectively removing the dielectric layers;
    forming a first word line with a first side and a second side opposite the first side, by depositing a first word line metal on the plurality of pre-word line extensions to electrically connect the plurality of pre-word line extensions;
    patterning the alternating dielectric layers and single crystalline-like silicon layers to form a plurality of bit line openings, each bit line opening extending through the alternating dielectric layers and single crystalline-like silicon layers;
    depositing a bit line metal in the plurality of bit line openings to form a plurality of bit lines, each bit line having a first side and a second side opposite the first side, the first side of the bit line adjacent the first side of the first word line; and
    forming a second word line with a first side and a second side opposite the first side, by depositing a second word line metal on the plurality of pre-word line extensions on the second side of the plurality of bit lines.

2. The method of claim 1, wherein the at least one channel is etched through an opening in a mask formed on the stack.

3. The method of claim 1, further comprising forming at least one first word line contact in electrical communication with the first word line and at least one second word line contact in electrical communication with the second word line.

4. The method of claim 3, wherein the at least one first word line contact and the at least one second word line contact extend through the alternating memory layers and dielectric layers a distance sufficient to terminate at one of the first word line or second word line, respectively.

5. The method of claim 1, wherein forming the first word line further comprises forming an oxide layer on the pre-word line extensions prior to depositing the first word line metal.

6. The method of claim 5, wherein forming the first word line further comprises forming a bit line metal seed layer on the oxide layer prior to depositing the bit line metal.

7. The method of claim 1, further comprising forming at least one pre-capacitor extension in the memory layer, the pre-capacitor extension in contact with the second side of the first word line; and forming a capacitor on the at least one pre-capacitor extension.

8. The method of claim 7, wherein forming the at least one pre-capacitor extension comprises selectively removing a portion of the single crystalline-like silicon layers on the second side of the first word line adjacent the first side of the plurality of bit lines; and wherein forming the capacitor comprises depositing one or more of a high-κ dielectric material or a word line metal on the at least one pre-capacitor extension.

9. The method of claim 7, wherein forming the at least one pre-capacitor extension comprises conformal doping of the single crystalline-like silicon layers to form a highly doped silicon layer on the second side of the first word line adjacent the first side of the plurality of bit lines, recessing the highly doped silicon layer to form a recess, and depositing a metal material in the recess; and wherein forming the capacitor comprises depositing one or more of a high-κ dielectric material or a word line metal on the at least one pre-capacitor extension.

10. The method of claim 7, further comprising selectively removing a portion of the memory layer on the second side of the second word line to form at least one second pre-capacitor extension; and forming a second capacitor on the at least one second pre-capacitor extension.

11. The method of claim 10, wherein forming the at least one second pre-capacitor extension comprises selectively removing a portion of the single crystalline-like silicon layers on the second side of the second word line adjacent the first side of the plurality of bit lines; and wherein forming the second capacitor comprises depositing one or more of a high-κ dielectric material or a word line metal on the at least one second pre-capacitor extension.

12. The method of claim 10, wherein forming the at least one second pre-capacitor extension comprises conformal doping of the single crystalline-like silicon layers to form a highly doped silicon layer on the second side of the second word line adjacent the first side of the plurality of bit lines, recessing the highly doped silicon layer to form a recess, and depositing a metal nitride material in the recess; and wherein forming the second capacitor comprises depositing one or more of a high-κ dielectric material or a word line metal on the second pre-capacitor extension.

\* \* \* \* \*